(12) United States Patent
Yamaguchi et al.

(10) Patent No.: US 8,319,108 B2
(45) Date of Patent: Nov. 27, 2012

(54) MOUNTING STRUCTURE AND ELECTRONIC EQUIPMENT

(75) Inventors: Atsushi Yamaguchi, Osaka (JP); Koso Matsuno, Osaka (JP); Ryo Kuwabara, Osaka (JP); Hiroe Kowada, Osaka (JP); Kimiaki Nakaya, Osaka (JP)

(73) Assignee: Panasonic Corporation, Osaka (JP)

( * ) Notice: Subject to any disclaimer, the term of this patent is extended or adjusted under 35 U.S.C. 154(b) by 618 days.

(21) Appl. No.: 12/535,760

(22) Filed: Aug. 5, 2009

(65) Prior Publication Data

US 2010/0032190 A1 Feb. 11, 2010

(30) Foreign Application Priority Data

Aug. 8, 2008 (JP) ................................. 2008-206079

(51) Int. Cl.
*H05K 7/20* (2006.01)
(52) U.S. Cl. ........ 174/252; 174/250; 257/783; 428/143; 361/712
(58) Field of Classification Search .................... 174/252
See application file for complete search history.

(56) References Cited

U.S. PATENT DOCUMENTS

| | | | | |
|---|---|---|---|---|
| 5,834,101 A | * | 11/1998 | Hayashi | 428/209 |
| 6,225,701 B1 | * | 5/2001 | Hori et al. | 257/783 |
| 6,245,400 B1 | * | 6/2001 | Tzeng et al. | 428/40.1 |
| 6,570,099 B1 | * | 5/2003 | Hirano et al. | 174/258 |
| 7,229,683 B2 | * | 6/2007 | Fischer et al. | 428/293.7 |
| 8,007,897 B2 | * | 8/2011 | Ito et al. | 428/143 |
| 2005/0041373 A1 | * | 2/2005 | Pruss et al. | 361/508 |

FOREIGN PATENT DOCUMENTS

| | | |
|---|---|---|
| JP | 04-012556 | 1/1992 |
| JP | 04-155853 | 5/1992 |
| JP | 06-232294 | 8/1994 |

* cited by examiner

*Primary Examiner* — Timothy Thompson
*Assistant Examiner* — Hiram E Gonzalez
(74) *Attorney, Agent, or Firm* — McDermott Will & Emery LLP

(57) ABSTRACT

A mounting structure formed by bonding the electrodes of a substantially planar electronic component to the electrodes provided on the mounting surface of a circuit board includes a sealing body 5 formed between one main surface of the electronic component and the circuit board and/or on the other main surface of the electronic component. The sealing body 5 is composed of a plurality of layers having different adhesive strengths and thermal conductivities, wherein a layer having a relatively high adhesion strength is arranged in a region being in contact with either one of the electronic component and the circuit board, and a layer having a relatively high thermal conductivity is arranged in a region being in contact with none of the electronic component and the circuit board.

13 Claims, 6 Drawing Sheets

MOUNTING STRUCTURE AND ELECTRONIC EQUIPMENT

FIELD OF THE INVENTION

The invention relates to a mounting structure using a resin composition as a sealing material, and an electronic equipment incorporating the mounting structure.

BACKGROUND OF THE INVENTION

In recent years, electronic equipment has been required to be smaller in size and more functional and operate at higher speed. In order to realize such requirements, electronic components such as semiconductor devices need to be highly densely mounted in equipment. In response to such a need, there have been developed a mounting structure in which a semiconductor chip including a non-packaged bare IC is directly mounted on a circuit board.

FIG. 6A shows a cross section of the conventional mounting structure including a semiconductor chip mounted on the circuit board. A mounting structure 200 comprises a semiconductor chip 1 and a circuit board 2. The semiconductor chip 1 includes a bare IC 11 and an interposer board 12 with the bare IC 11 mounted thereon. On a surface of the interposer board 12 opposite to the surface on which the bare IC 11 is mounted, solder balls 13 serving as terminal electrodes are formed. The solder balls 13 and lands (electrodes) 21 formed on the mounting surface of the circuit board 2 are bonded to each other with a solder 3, so that the semiconductor chip 1 is mounted on the circuit board 2. It should be noted that in FIG. 6A, only the bare IC 11 is shown not by a cross section but by a hollow rectangle representing the contour.

In such a conventional mounting structure, after a semiconductor device is secured to the circuit board by soldering such as reflow soldering, sealing of the soldered portion with resin (hereinafter referred to as "resin-sealing") is generally performed for the purpose of ensuring the reliability of the mounting structure including an electronic component. Specifically, the resin-sealing is performed for the purpose of preventing a contact failure between the semiconductor device and the circuit board that may occur when the mounting structure undergoes repeated heat cycles or suffers an impact due to dropping etc.

To be concrete, as shown in FIG. 6A, in the space between the semiconductor chip 1 and the circuit board 2 where the electrodes formed thereon are bonded to each other with the solder 3, there is formed an electrically insulating sealing body 4 mainly composed of a thermosetting resin. Since the semiconductor chip 1 and the circuit board 2 are secured to each other with the sealing body 4, it is possible to prevent separation or cracks from occurring at the bonding portion formed of the solder 3, when a thermal or mechanical stress is externally applied to the mounting structure.

On the other hand, with the improvement in functionality and the increase in speed of operation of electronic equipment, the semiconductor device constituting the mounding structure tends to consume more power. For this reason, in addition to the need for highly dense mounting, there has been an increasing need for a mounting structure of an electronic component capable of excellent heat dissipation mounting, that is, capable of realizing an excellent heat dissipation performance.

In order to improve the heat dissipation performance of the mounting structure of an electronic component, in the conventional techniques, the amount of heat to be dissipated has been increased by attaching a heat dissipation board to the semiconductor device or electronic component that is required to be capable of dissipating heat, or alternatively by adding a modification to the configuration of the mounting structure (see, for example, Japanese Laid-Open Patent Publication No. Hei 4-155853, Japanese Laid-Open Patent Publication No. Hei 4-12556, and Japanese Laid-Open Patent Publication No. Hei 6-232294). However, attaching a heat dissipation board or adding a modification to the configuration has resulted in an increase of the volume of the mounting structure. This means that the electronic equipment incorporating such a mounting structure with an increased volume becomes large in size, which contradicts the need for reduction in size.

Under these circumstances, in order to improve the heat dissipation performance of the mounting structure of an electronic component, the utilization of the above-described sealing body has been considered. The sealing body allows heat generated in the semiconductor device or electronic component to be released therethrough to the housing of the electronic equipment or in the open air, enabling the amount of heat dissipated to be increased without resulting in an increase of the volume of the mounting structure.

The sealing body of the mounting structure has been improved in view of improvement in heat dissipation performance and prevention of cracks. FIG. 6B shows a partial cross-sectional view taken along the line VIB-IVB of the mounting structure 200 of FIG. 6A. The sealing body 4 is formed by mixing a filler 41 with a resin 40 mainly composed of a thermosetting resin. The filler 41 is made of an electrically insulating material having a comparatively good thermal conductive property. The filler 41 is mixed for the purpose of improving various properties of the sealing body 4, in particular, the thermal conductivity and the adhesive strength.

As discussed above, conventionally, the properties of the sealing body has been improved, and the thermal conductivity has been increased. However, if a large amount of the filler 41 is mixed with the sealing body 4 in order to obtain a sufficient heat dissipation performance in the mounting structure, the adhesion between the sealing body 4, and the semiconductor chip 1 and the circuit board 2 becomes insufficient, and the adhesive strength exerted by the sealing body 4 may be adversely reduced. For this reason, currently, the heat dissipation performance obtained by the conventional heat dissipation configuration utilizing the sealing body 4 is not sufficient enough to meet the needs for improving the functionality and increasing the speed of operation of electronic equipment.

The invention is made in order to solve the above conventional problems and intends to provide a mounting structure satisfying both conditions of adhesive strength and heat dissipation performance required for the sealing body.

BRIEF SUMMARY OF THE INVENTION

In order to achieve the above purpose, the invention provides a mounting structure including:

an electronic component having a plurality of terminals;

a circuit board having a plurality of electrodes arranged so as to face the terminals;

a bonding portion where the terminals and the electrodes corresponding to the terminals are bonded to each other; and a sealing body containing a resin for sealing at least the bonding portion, wherein the sealing body is formed such that, in at least part thereof, a region near an interface with at least one of the circuit board and the electronic component has a relatively high adhesion, and a region away from the interface has a relatively high thermal conductivity.

In a preferred embodiment of the invention, the sealing body is configured such that, in at least part thereof, a layer having a relatively high adhesion and being in contact with at least one of the circuit board and the electronic component, and a layer having a relatively high thermal conductivity and being in contact with none of the circuit board and the electronic component are laminated to each other.

In another preferred embodiment of the invention, the layer having a relatively high adhesion is formed of a resin composition including a spherical filler with a thermosetting resin.

In another embodiment of the invention, the layer having a relatively high thermal conductivity is formed of a resin composition including a scale-like filler with a thermosetting resin.

In another embodiment of the invention, the layer having a relatively high adhesion contains the spherical filler in an amount of 60 to 80% by weight.

In another embodiment of the invention, the layer having a relatively high thermal conductivity contains the scale-like filler in an amount of 10 to 90% by weight.

In another preferred embodiment of the invention, the sealing body includes:

a gap-filling portion formed so as to fill a gap between the electronic component and the circuit board; and a reinforcing portion disposed around a circumference of the gap-filling portion, wherein the gap-filling portion is configured such that the layer having a relatively high adhesion and the layer having a relatively high thermal conductivity are laminated to each other, and the reinforcing portion is formed of a resin composition containing a spherical filler.

In another preferred embodiment of the invention, the sealing body includes:

a gap-filling portion formed so as to fill a gap between the electronic component and the circuit board; and a top side portion formed on a surface of the electronic component opposite to the surface facing the circuit board, wherein at least the top side portion is configured such that the layer having a relatively high adhesion and the layer having a relatively high thermal conductivity are laminated to each other.

In another preferred embodiment of the invention, the sealing body includes:

a gap-filling portion formed so as to fill a gap between the electronic component and the circuit board; and a cover portion formed so as to close the electronic component and the gap-filling portion in cooperation with the circuit board, wherein at least the cover portion is configured such that the layer having a relatively high adhesion and the layer having a relatively high thermal conductivity are laminated to each other.

In another preferred embodiment of the invention, the sealing body is configured such that, in at least part thereof, a plurality of layers are laminated to each other such that the adhesion is reduced stepwise from the region near the interface with at least one of the circuit board and the electronic component toward the region away from the interface, and the thermal conductivity is increased stepwise from the region near the interface toward the region away from the interface.

In another preferred embodiment of the invention, the sealing body is formed such that, in at least part thereof, the adhesion is reduced gradually from the region near the interface with at least one of the circuit board and the electronic component toward the region away from the interface, and the thermal conductivity is increased gradually from the region near the interface toward the region away from the interface.

Further, the invention provides an electronic equipment having a housing and incorporating the above-described mounting structure, wherein the circuit board is brought into contact with the housing with a heat dissipation sheet or a highly thermally conductive adhesive interposed therebetween.

Furthermore, the invention provides an electronic equipment having a housing and incorporating the above-described mounting structure, wherein the layer having a relatively high thermal conductivity is brought into contact with the housing with a heat dissipation sheet or a highly thermally conductive adhesive interposed therebetween.

According to the mounting structure of the invention, it is possible to improve the adhesion between the sealing body, and the semiconductor chip and the circuit board, thereby to improve the adhesive strength between the electronic component and the circuit board, while increasing the thermal conductivity of the sealing body. As such, both conditions of adhesive strength and heat dissipation performance required for the sealing body can be simultaneously satisfied. Consequently, the restriction in terms of heat dissipation, which is associated with reducing the size of electronic equipment, can be minimized. It is therefore possible to realize a mounting structure which can be utilized in reducing the size, improving the functionality, and increasing the speed of operation of electronic equipment.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Each embodiment of the invention is described below with reference to the drawings.

Embodiment 1

Figure 1A:
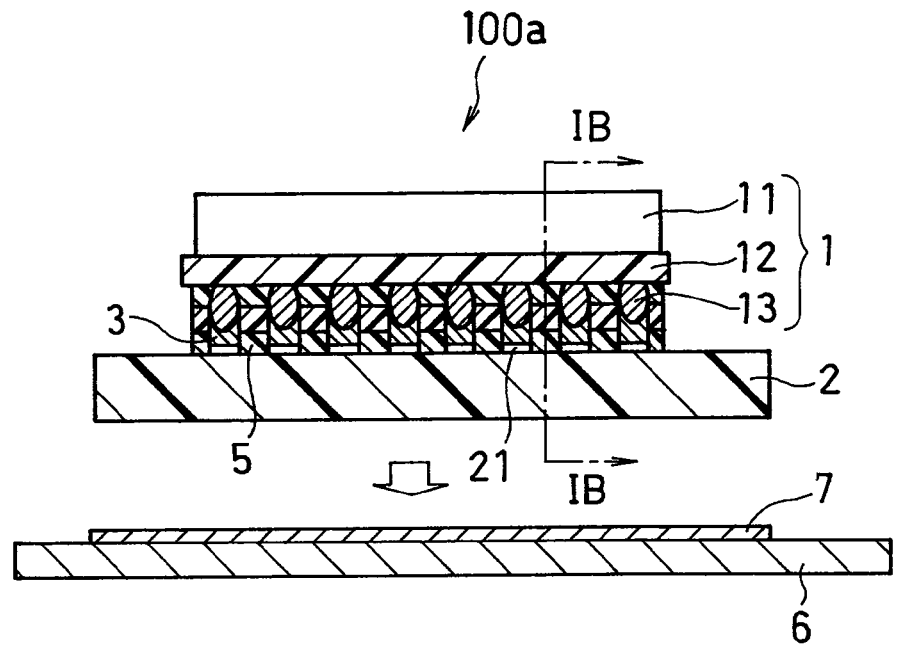
FIG. 1A is a cross-sectional view schematically showing the configuration of a mounting structure according to Embodiment 1 of the invention.

The cross section of a mounting structure according to Embodiment 1 of the invention is shown in FIG. 1A. A mounting structure 100a shown in the figure comprises the semiconductor chip 1 and the circuit board 2. The semiconductor chip 1, as in the case of the conventional mounting structure 200, includes the bare IC 11 and the interposer board 12. On a surface of the interposer board 12 opposite to the surface on which the bare IC 11 is placed, the solder balls 13 serving as terminal electrodes are formed. The solder balls 13 and the lands 21 serving as electrodes of the circuit board 2 are boned to each other with the solder 3, so that the semiconductor chip 1 is mounted on the circuit board 2.

As shown in FIG. 1A, in the gap between the semiconductor chip 1 (to be more precise, the interposer board 12) and the circuit board 2, which are bonded together with the solder 3, an electrically insulating sealing body 5 containing a thermosetting resin is formed so as to fill the gap. The purpose of providing the sealing body 5 is the same as in the case of the conventional mounting structure. Specifically, by providing the sealing body 5, the semiconductor chip 1 is securely bonded to the circuit board 2, which prevents separation or cracks that may occur at the bonding portion formed of the solder 3 when a thermal or mechanical stress is externally applied to the mounting structure.

Figure 1B:
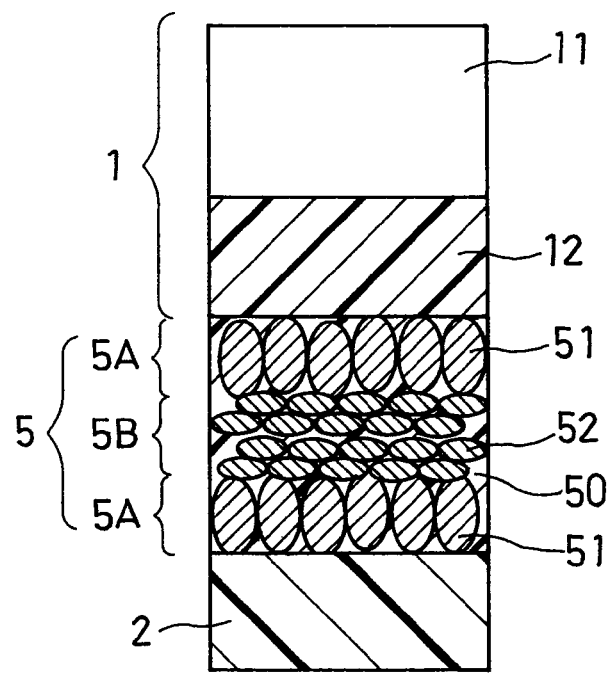
FIG. 1B is an enlarged cross-sectional view taken along the line IB-IB in FIG. 1A of the mounting structure.
Figure 6A:
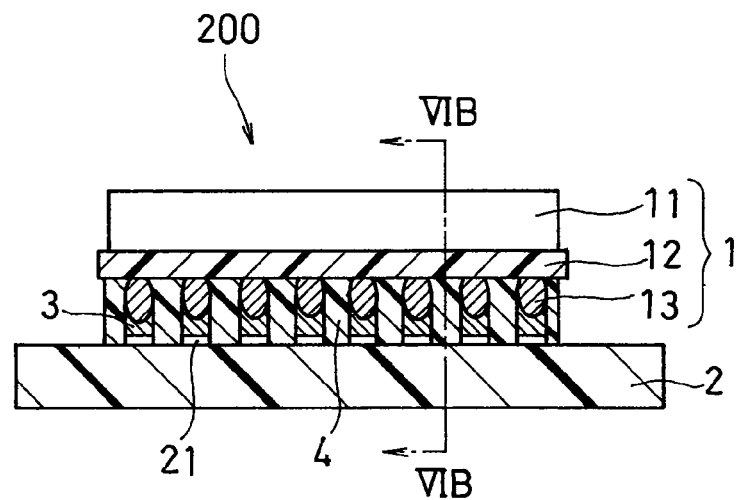
FIG. 6A is a cross-sectional view schematically showing the configuration of a conventional mounting structure.
Figure 6B:
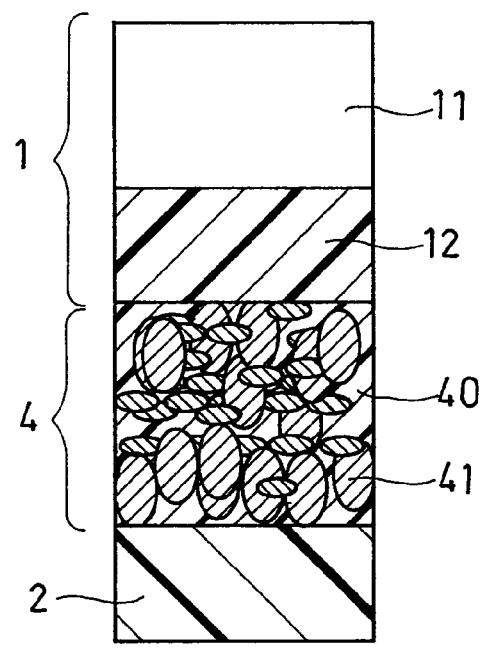
FIG. 6B is a cross-sectional view taken along the line VIB-VIB in FIG. 6A of the mounting structure.

The partially enlarged cross-sectional view taken along the line IB-IB of the mounting structure 100a in FIG. 1A is shown in FIG. 1B. In the conventional mounting structure 200 (see FIGS. 6A and 6B), the sealing body 4 is a one-layer composition prepared by mixing the filler 41 with the resin 40 mainly composed of a thermosetting resin. In contrast, in the mounting structure 100a according to the invention, the sealing body 5 is a three-layer structure formed by layering a first layer 5A and a second layer 5B in the predetermined order, the layers different from each other in the shape of the fillers contained therein. Here, the adhesion of the first layer 5A is relatively higher than that of the second layer 5B. In addition, the thermal conductivity of the second layer 5B is relatively higher than that of the first layer 5A. In FIG. 1B, for better understanding of the mixed state of the fillers, the shapes of the fillers are schematically shown with exaggeration.

As shown in FIG. 1B, the first layer 5A is arranged inside the sealing body 5 at each of the regions where the sealing body 5 is in contact with the semiconductor chip 1 (to be more precise, the interposer board 12) and with the circuit board 2. The first layer 5A is made of a resin composition prepared by mixing a spherical filler 51 with a resin 50 mainly composed of a thermosetting resin. The second layer 5B is arranged inside the sealing body 5 at the region where the sealing body 5 is in contact with none of the semiconductor chip 1 and the circuit board 2. The second layer 5B is made of a resin composition prepared by mixing the spherical filler 51 and a scale-like filler 52 with the resin 50 at a predetermined ratio as described below. It should be noted that, as shown in Examples given below, the second layer 5B may be formed such that only the scale-like filler 52 is contained as a filler.

As described above, the sealing body 5 is formed into a three-layer structure composed of two types of layers 5A and 5B that are different from each other in the shape of the filler contained therein, intending to achieving both conditions of adhesive strength and heat dissipation performance required for the sealing body. Note that in FIG. 1B, in order to emphasize the difference in the shape of the filler contained in the first layer 5A and the second layer 5B, only the scale-like filler 52 is shown in the second layer 5B.

The differences in the composition and the property between the first layer 5A and the second layer 5B are described below. The first layers 5A disposed at the interfaces with the semiconductor chip 1 and the circuit board 2 contains only the spherical filler 51 as a filler; and the second layer 5B that does not include the foregoing interfaces contains only the scale-like filler 52 as a filler. The purpose of doing this is to increase, in the first layers 5A disposed at the interfaces, the contact areas of the resin 50 with the semiconductor chip 1 and the circuit board 2, thereby to improve the adhesion. In short, when only the spherical filler 51 is mixed with the resin 50, the adhesion at the interfaces with the semiconductor chip 1 and the circuit board 2 is improved.

Conversely, in the second layer 5B that does not include the interfaces, the contact area between the particles of the filler is increased in order to increase the thermal conductivity. In short, when the scale-like filler 52 is mixed with the resin 50, the area where the particles of the filler are in contact with one another is increased, and thus the heat transfer performance is improved. Disadvantageously, however, the gaps between the particles of the filler is unlikely formed, and thus the adhesion is reduced.

More specifically, by mixing only the spherical filler 51 in the first layer 5A, the contact areas of the resin 50 with the semiconductor chip 1 and the circuit board 2 at the interfaces are increased, and thus the adhesive strength is increased. In the case where the spherical filler 51 is mixed with the resin 50, the contact areas with the semiconductor chip 1 and the circuit board 2 are larger than those in the case where a filler having a shape other than sphere is mixed with the resin 50, provided that the filler contents are the same.

The filler content in the first layer 5A is preferably 60 to 90% by weight. If the filler content is less than 60% by weight, the heat transfer is insufficient and the heat dissipation performance is reduced. If the filler content is more than 90% by weight, the adhesion is insufficient. More preferably, the filler content in the first layer 5A is in the range of 60 to 80% by weight. The particle size of the spherical filler 51 is not particularly limited, but preferably 0.5 to 30 μm (median), in terms of simultaneously satisfying the requirements for the sealing body with respect to the thermal conductivity and the adhesive strength.

In contrast, the second layer 5B that does not include the interfaces with the semiconductor chip 1 and the circuit board 2 contains the spherical filler 51 and the scale-like filler 52 (as in the description above, the second layer 5B may contain only the scale-like filler 52). When the second layer 5B contains the scale-like filler 52, the contact area between the particles of the filler is increased as compared to when the second layer 5B contains only the spherical filler 51, and thus the heat dissipation performance is improved. The content of the scale-like filler 52 relative to the total filler content in the second layer 5B is preferably 10% by weight or more. If the content of the scale-like filler is less than 10% by weight, the above effect that can be obtained when the layer contains the scale-like filler is hardly obtained. More preferably, the content of the scale-like filler 52 relative to the total filler content in the second layer 5B is 11% by weight or more.

The total filler content in the second layer 5B is preferably 60 to 90% by weight. If the total filler content in the second layer 5B is less than 60% by weight, the thermal conductivity cannot be sufficiently improved. If the total filler content in the second layer 5B is more than 90% by weight, the sealing body 5 becomes so brittle that the reliability of the electronic equipment is difficult to be ensured.

The length of the scale-like filler 52 is not particularly limited, but preferably 5 to 20 μm, in terms of obtaining a significant effect of improving the thermal conductivity.

The shape of the filler contained in the second layer 5B is not limited to the "scale-like" shape, and may be any shape as long as it is not the "spherical" shape. The reason for this is that the shape other than the "spherical" shape provides a larger contact area between the particles than the "spherical" shape, provided that the two shapes have the same volume. However, in reality, the most significant effect of improving the thermal conductivity can be obtained when the shape of the filler to be contained in the second layer 5B is the "scale-like" shape.

The "scale-like" shape as used herein refers to the shape of a flake that is formed naturally when an electrically insulating inorganic material (e.g., alumina) used as a raw material of the filler is compressed at a pressure equal to or higher than a predetermined pressure.

The mounting structure 100a according to this embodiment is effective in dissipating heat generated from the semiconductor chip 1 to the housing of the electronic equipment from the circuit board 2 side. Specifically, as shown in FIG. 1A, the mounting structure 100a is moved in the direction indicated by the arrow, so that the mounting structure 100a comes in contact with a housing 6 made of metal of the electronic equipment with, for example, a carbon sheet 7 interposed therebetween. In such a state, the heat generated in the semiconductor chip 1 is transferred through the sealing body 5 in the order of the first layer 5A, the second layer 5B, and the first layer 5A, then the circuit board 2, and the carbon sheet 7 to reach the housing 6, from which the heat is dissipated outside the electronic equipment. It should be noted that in place of the carbon sheet 7, a highly thermally conductive resin, such as a gelled material, a thermosetting resin, and a rubber, may be used to adhere or bring the circuit board 2 to or into contact with the housing 6, which provides the same effect as described above.

The method of producing the mounting structure 100a is briefly described below. First, the semiconductor chip 1 and the circuit board 2 are prepared. Onto the surface of the semiconductor chip 1 where the solder balls 13 are formed and the surface of the circuit board 2 where the lands 21 are formed, a resin composition prepared by mixing the spherical filler 51 with the resin 50 in an uncured state is applied. After the resin 50 is allowed to dry, each of the surfaces is polished, so that the solder balls 13 of the semiconductor chip 1 and the lands 21 of the circuit board 2 are exposed.

Secondly, a solder paste being a raw material of the solder 3 is applied onto the lands 21 on the circuit board 2, and the semiconductor chip 1 is placed on the circuit board 2 with the solder paste interposed therebetween and is temporarily secured. Thereafter, the circuit board 2 on which the semiconductor chip 1 is temporarily secured is heated by passing it through a reflow oven, during which the solder paste is melted and the semiconductor chip 1 is secured to the circuit board 2.

A resin composition prepared by mixing the scale-like filler 52 with the resin 50 in an uncured state is filled by means of a capillary phenomenon into the gap between the interposer board 12 of the semiconductor chip 1 secured to the circuit board 2 in the process above and the circuit board 2. Lastly, the resin 50 is cured by heating, whereby the mounting structure 100a is produced.

Figure 2A:
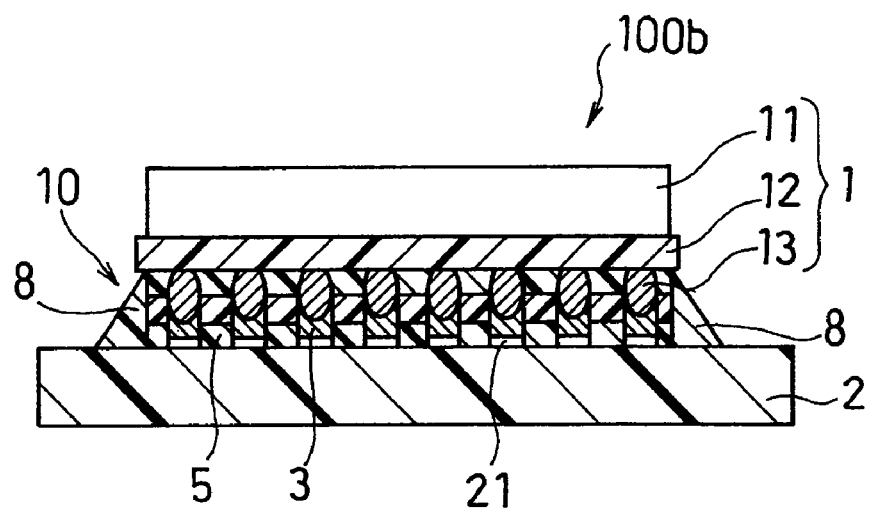
FIG. 2A is a cross-sectional view schematically showing the configuration of a variant example of the mounting structure.
Figure 2B:
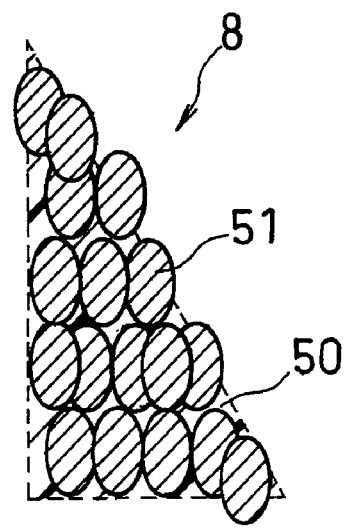
FIG. 2B is an enlarged cross-sectional view showing a part of the variant example.

A mounting structure 100b shown in FIGS. 2A and 2B is a variant example of the mounting structure 100a of this embodiment. The schematic configuration of the mounting structure 100b is shown as a cross-sectional view in FIG. 2A; and the characteristic portion of this variant example in FIG. 2A is shown as an enlarged cross-sectional view in FIG. 2B. In FIG. 2B, as in FIG. 1B, for better understanding of the mixed state of the filler, the shape of the filler is schematically shown with exaggeration. Note that in the figures, the components having the same functions as those in the mounting structure in FIGS. 1A and 1B are denoted by the same reference numerals, and the descriptions thereof are omitted. The same applies to the following description.

In the mounting structure 100b, a reinforcing portion 8 is provided around the circumference of the sealing body 5 in the mounting structure 100a shown in FIG. 1A, forming another type of a sealing body 10. The reinforcing portion 8 is formed of a resin composition prepared by mixing only the spherical filler 51 with the resin 50. The reinforcing portion 8, because of mixing of only the spherical filler 51 therein, contributes mainly to the improvement of the adhesive strength.

By providing the reinforcing portion 8, it is possible to obtain a sufficient adhesive strength that can reinforce the adhesive strength in the mounting structure 100a shown in FIG. 1A, in which the adhesive strength provided by the sealing body 5 alone may become insufficient as a result of forming the sealing body 5 in a three-layer structure. The reinforcing portion 8 can be formed after the formation of the sealing body 5 (the gap-filling portion in the sealing body of this embodiment), by applying around the circumference thereof, the resin composition prepared by mixing the spherical filler 51 with the resin 50, with a dispenser.

Embodiment 2

Figure 3A:
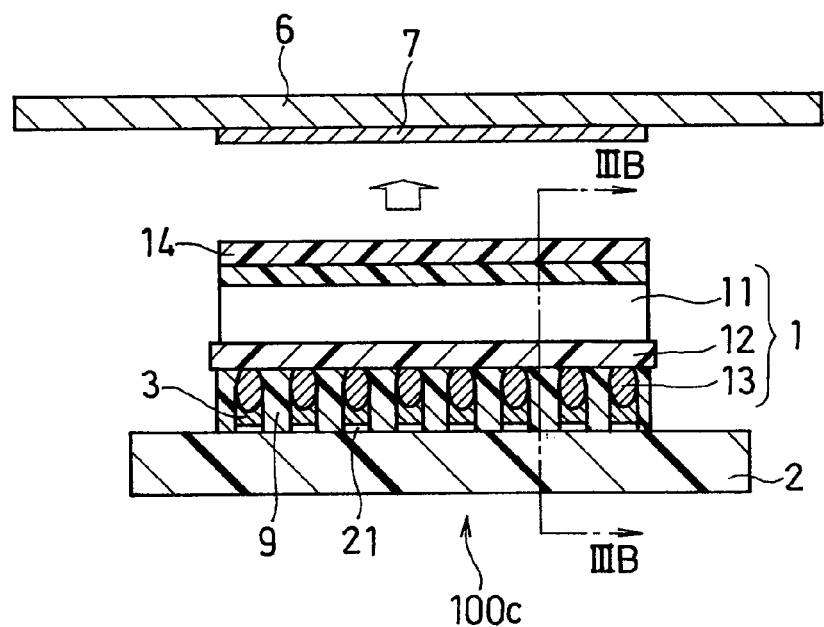
FIG. 3A is a cross-sectional view schematically showing the configuration of a mounting structure according to Embodiment 2 of the invention.
Figure 3B:
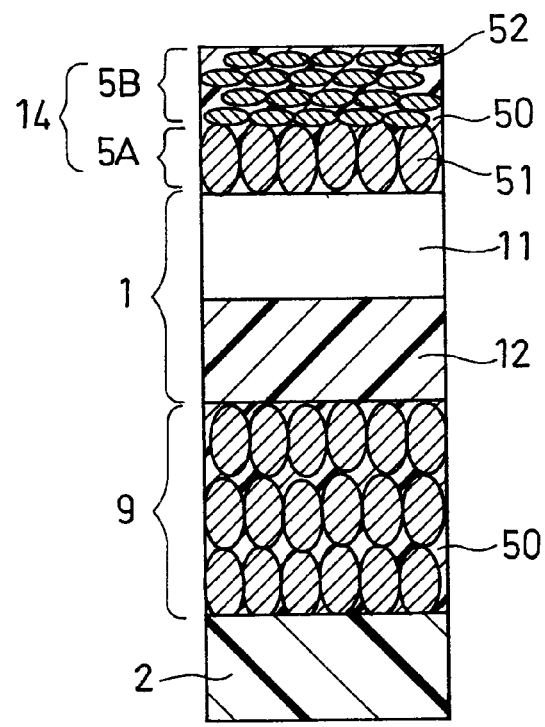
FIG. 3B is an enlarged cross-sectional view taken along the line IIIB-IIIB in FIG. 3A of the mounting structure.

The cross section of a mounting structure 100c according to Embodiment 2 of the invention is shown in FIG. 3A. The partial cross section taken along the line IIIB-IIIB of the mounting structure 100c in FIG. 3A is shown in FIG. 3B. In FIG. 3B, as in FIG. 1B, for better understanding of the mixed state of the fillers, the shapes of the fillers are schematically shown with exaggeration.

In the mounting structure 100a of Embodiment 1, the sealing body 5 composed of two layers having different compositions (the sealing body 5 structurally composed of three layers) is provided in the gap between the semiconductor chip 1 and the circuit board 2. In the mounting structure 100c of this embodiment, a gap-filling portion 9 serving as a sealing body is provided in the gap between the semiconductor chip 1 and the circuit board 2, and a top side portion 14 serving as an additional sealing body is provided on the top surface of the semiconductor chip 1 (the surface of the semiconductor chip 1 opposite to the surface facing the circuit board 2).

The gap-filling portion 9 serving as a sealing body of this embodiment is formed of the resin composition prepared by mixing only the spherical filler 51 with the resin 50, and has the same function as the conventional sealing body 4 (see FIG. 6).

In the top side portion 14 serving as an additional sealing body of this embodiment, the region being in contact with the top surface of the semiconductor chip 1 is composed of the first layer 5A; and the region not being in contact with the top surface of the semiconductor chip 1 is composed of the second layer 5B.

The mounting structure 100c of this embodiment is effective in dissipating heat generated by the semiconductor chip 1 to the housing of the electronic equipment from the top surface side of the semiconductor chip 1. Specifically, as shown in FIG. 3A, the mounting structure 100c is moved in the direction indicated by the arrow, so that the top side portion 14 formed on the top surface of the semiconductor chip 1 comes in contact with the housing 6 made of metal of the electronic equipment with the carbon sheet 7 interposed therebetween. In such a state, the heat generated by the semiconductor chip 1 is transferred through the first layer 5A and the second layer 5B in the top side portion 14, and the carbon sheet 7 to reach the housing 6, and then dissipated externally from the surface of the housing 6.

As shown in FIG. 3B, at the interface with the semiconductor chip 1 (to be more precise, the bare IC 11), the first layer 5A containing only the spherical filler 51 is formed, which is excellent in adhesion. Because of the presence of the first layer 5A, the adhesive strength of the entire top side portion 14 is increased. As such, it is possible to prevent separation from occurring at the interface between the top surface of the semiconductor chip 1 and the sealing body, when a thermal stress is applied as the heat is generated in the semiconductor chip 1. At the region of the top side portion 14 to be brought into contact with the carbon sheet 7, the second layer 5B containing only the scale-like filler 52 is provided. Since the second layer 5B is excellent in thermal conductive property, the heat generated in the semiconductor chip 1 can be efficiently transferred to the housing 6.

The gap-filling portion 9 between the semiconductor chip 1 and the circuit board 2 is formed of the resin composition containing only the spherical filler 51 and, therefore, has a sufficient adhesion. As such, it is possible to prevent separation or cracks from occurring at the bonding portion formed of the solder 3, even when a thermal or mechanical stress is externally applied to the mounting structure.

In forming the top side portion 14, a resin composition prepared by mixing the spherical filler 51 with the resin 50 in an uncured state is first applied onto the top surface of the semiconductor chip 1 boned to the circuit board 2. After the resin 50 is allowed to dry, a resin composition prepared by mixing the scale-like filler 52 with the resin 50 in an uncured state is secondly applied onto the dried resin 50. Finally, the resin 50 is cured by heating. The gap-filling portion 9 is formed in the conventional manner. Specifically, after the semiconductor chip 1 is bonded to the circuit board by reflow soldering, a resin composition prepared by mixing the spherical filler 51 with the resin 50 in an uncured state is filled into the gap by means of a capillary phenomenon, and then cured by heating.

It should be noted that the top side portion 14 of this embodiment is formed to be a two-layer structure composed of the first layer 5A and the second layer 5B, but the structure thereof is not limited thereto. The top side portion 14 may be formed in three or more layers, and the shape and amount of the filler mixed with the resin 50 may be varied with distance from the interface. With such a configuration, the thermal conductivity gradient is given such that the thermal conductivity increases vertically upward from the top surface of the semiconductor chip 1, and thus the heat generated in the semiconductor chip 1 can be efficiently transferred to the housing 6.

It should be further noted that, although the gap-filling portion 9 containing only the spherical filler 51 is formed between the semiconductor chip 1 and the circuit board 2 in this embodiment, the gap-filling portion 9 may be replaced with the sealing body 5 of Embodiment 1. With such a configuration, the heat dissipation performance of the mounting structure can be further improved.

Embodiment 3

Figure 4A:
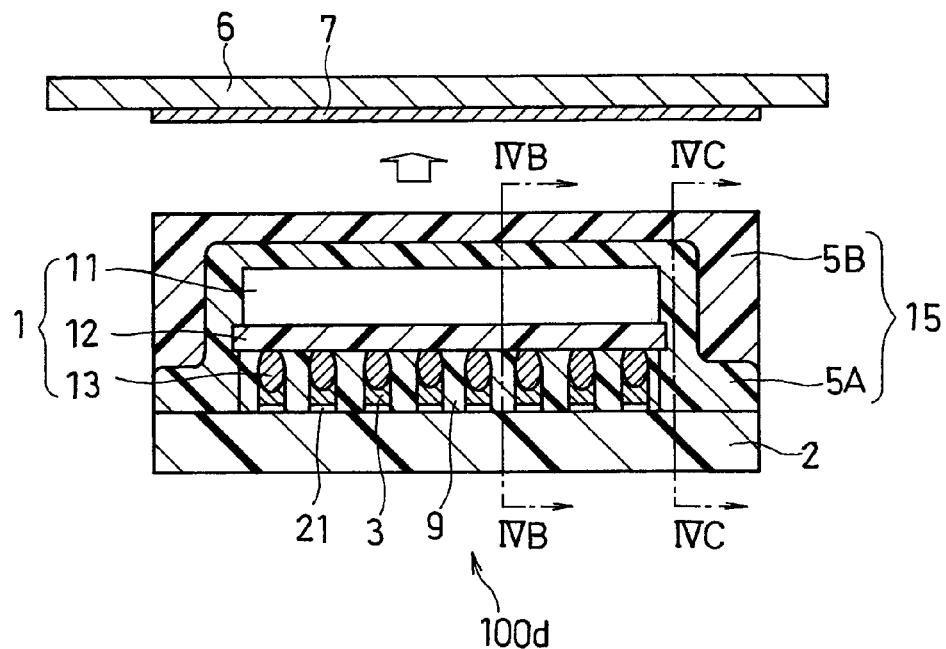
FIG. 4A is a cross-sectional view schematically showing the configuration of a mounting structure according to Embodiment 3 of the invention.
Figure 4B:
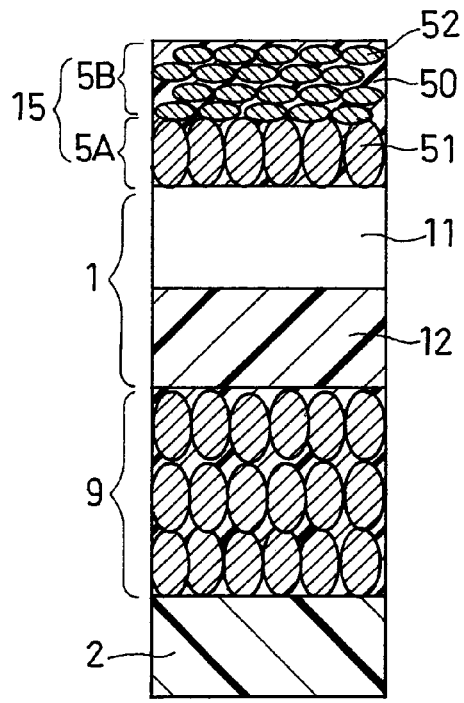
FIG. 4B is an enlarged cross-sectional view taken along the line IVB-IVB in FIG. 4A of the mounting structure.
Figure 4C:
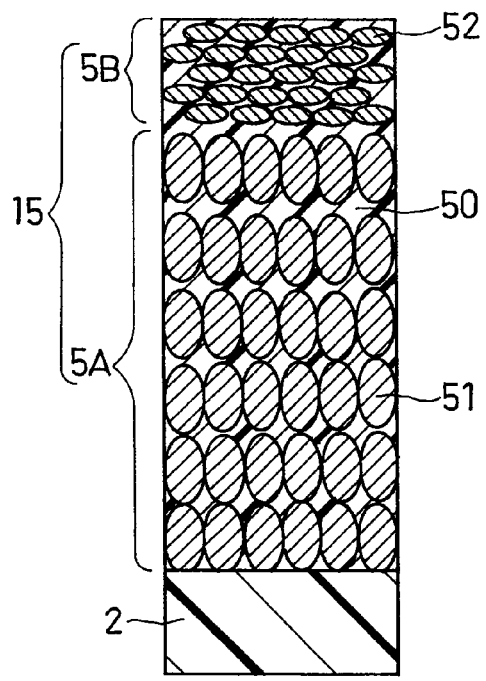
FIG. 4C is an enlarged cross-sectional view taken along the line IVC-IVC in FIG. 4A of the mounting structure.

The cross section of a mounting structure 100d according to Embodiment 3 of the invention is shown in FIG. 4A. The partial cross section taken along the line IVB-IVB of the mounting structure 100d in FIG. 4A is shown in FIG. 4B. The partial cross section taken along the line IVC-IVC of the mounting structure 100d in FIG. 4A is shown in FIG. 4C. In FIGS. 4B and 4C, as in FIG. 1B, for better understanding of the mixed state of the fillers, the shapes of the fillers are schematically shown with exaggeration.

In the mounting structure 100c of Embodiment 2, the top side portion 14 composed of two layers having different compositions and properties is provided separately from the gap-filling portion 9 on the top surface of the semiconductor chip 1. In contrast, in the mounting structure 100d of this embodiment, the sealing body consists of the gap-filling portion 9 provided between the semiconductor chip 1 and the circuit board 2, and a cover portion 15 closing the semiconductor chip 1 in cooperation with the circuit board 2.

In the cover portion 15, as shown in FIG. 4A, the regions being in contact with the semiconductor chip 1 and the circuit board 2 are composed of the first layer 5A, and the region being in contact with none of the semiconductor chip 1 and the circuit board 2 is composed of the second layer 5B.

As in the case of Embodiment 2, the mounting structure 100d of this embodiment is effective in dissipating heat generated from the semiconductor chip 1 to the housing of the electronic equipment from the top surface side of the semiconductor chip 1. Specifically, as shown in FIG. 4A, the mounting structure 100d is moved in the direction indicated by the arrow, so that the cover portion 15 formed on the top surface of the semiconductor chip 1 comes in contact with the housing 6 made of metal of the electronic equipment with the carbon sheet 7 interposed therebetween. The heat generated in the semiconductor chip 1 is transferred through the first layer 5A and the second layer 5B in the cover portion 15, and the carbon sheet 7 to reach the housing 6, and then dissipated from the surface of the housing 6.

As shown in FIGS. 4B and 4C, the first layers 5A containing only the spherical filler 51 are formed at the interfaces with the semiconductor chip 1 and the circuit board 2. Since the first layer 5A is excellent in adhesion, it is possible to prevent separation or cracks from occurring at the interfaces with the semiconductor chip 1 and the circuit board 2, even when a thermal or mechanical stress is externally applied to the mounting structure. On the other hand, the second layer 5B containing only the scale-like filler 52 is formed at the region to be brought into contact with the carbon sheet 7. Since the second layer 5B is excellent in thermal conductive property, the heat generated in the semiconductor chip 1 can be efficiently transferred to the housing 6.

The gap-filling portion 9 between the semiconductor chip 1 and the circuit board 2 is formed of the resin composition containing only the spherical filler 51. As such, it is possible to prevent separation or cracks from occurring at the bonding portion formed of the solder 3, even when a thermal or mechanical stress is externally applied to the mounting structure.

The method of producing the mounting structure 100d according to this embodiment is described below with reference to FIGS. 5A, 5B and 5C. In a preparatory step (not shown), a mounting structure 100e having the same configuration as that of the conventional mounting structure 200 (see FIG. 6) is produced, the configuration being such that the semiconductor chip 1 is bonded to the mounting surface of the circuit board 2 by soldering, and the gap-filling portion 9 is formed in the gap between the semiconductor chip 1 and the circuit board 2.

Figure 5A:
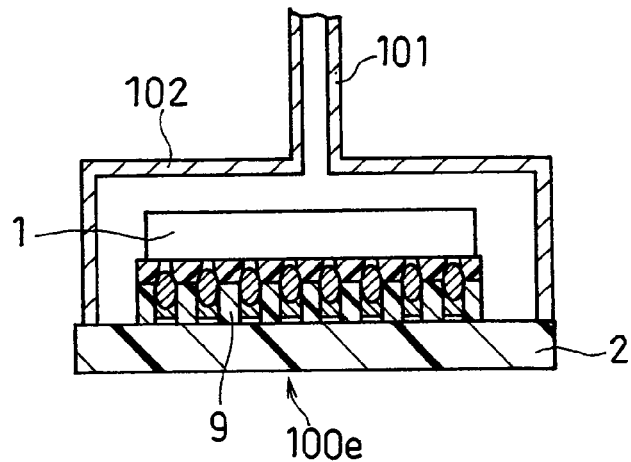
FIG. 5A is a cross-sectional view of a mounting structure and a production apparatus showing the first step of a production process of the mounting structure.
Figure 5B:
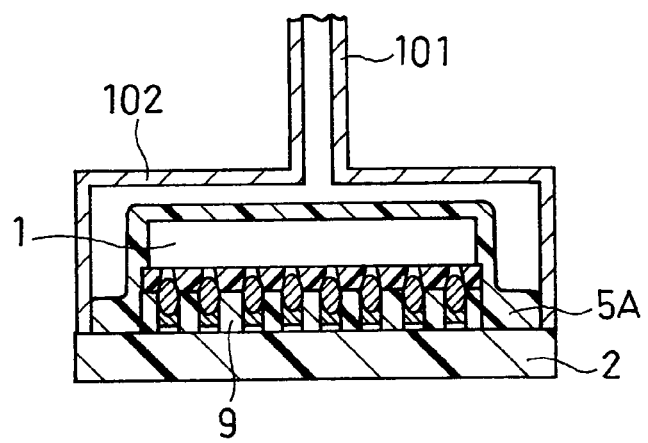
FIG. 5B is a cross-sectional view of a mounting structure and a production apparatus showing the second step of the production process of the mounting structure.
Figure 5C:
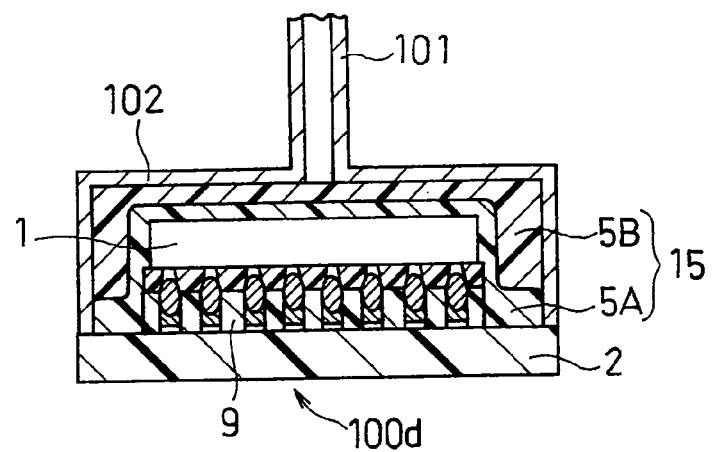
FIG. 5C is a cross-sectional view of a mounting structure and a production apparatus showing the third step of the production process of the mounting structure.

Next, as shown in FIG. 5A, the mounting structure 100e thus produced is covered with a mold 102 having an injection port 101 on the top thereof. From the injection port 101, the resin composition prepared by mixing the spherical filler 51 with the resin 50 in an uncured state is injected to form the first layer 5A. FIG. 5B shows the state in which the first layer 5A is formed at the interfaces with the semiconductor chip 1 and the circuit board 2.

After the resin 50 of the first layer 5A is allowed to dry, the resin composition prepared by mixing the scale-like filler 52 with the resin 50 in an uncured state is injected from the injection port 101 to form the second layer 5B on the first layer 5A. FIG. 5C shows the state in which the second layer 5B is formed on the first layer 5A.

Lastly, the resin 50 in the first layer 5A and the second layer 5B is cured by heating. In such a manner, the mounting structure 100d configured such that the semiconductor chip 1 is completely sealed by the cover portion 15 having a two-layer structure composed of the first layer 5A and the second layer 5B.

Since the semiconductor chip 1 is completely covered by the sealing body including the cover portion 15 and the gap-filling portion 9, the mounting structure 100d according to this embodiment is excellent in weatherability. Further, since the semiconductor chip 1 is bonded to the circuit board 2 not only with the solder 3 but also with the cover portion 15 and the gap-filling portion 9, the mounting structure 100d is excellent in adhesive strength between the semiconductor chip 1 and the circuit board 2. Furthermore, since the area of the contact surface with the housing 6 serving as a heat dissipation surface is large, the mounting structure 100d is excellent in heat dissipation performance.

In the following, the resin 50 is specifically described. Examples of the thermosetting resin applicable as the resin 50 include an epoxy resin, a phenol resin, and an acrylic resin. Among these, an epoxy resin is appropriate in terms of the moisture absorbing property, the thermal expansion property, the shrinking property upon curing, and the like.

In the invention, it is possible to use a typical epoxy resin. A preferable epoxy resin is the one prepared by allowing a polyfunctional epoxy resin to contain a monofunctional epoxy resin as a reaction diluent (i.e., a crosslink density adjusting agent) in an amount of about 0 to 30% by weight, preferably about 0 to 20% by weight (both relative to the whole epoxy resin).

Examples of the polyfunctional epoxy resin include a bisphenol A-type epoxy resin, a bisphenol F-type epoxy resin, a phenol novolak-type epoxy resin, a cresol novolak-type epoxy resin, and the like. These epoxy resins may be used in combination of two or more. These may be selected in view of the viscosity and the physical properties. Preferably, the polyfunctional epoxy contains a bisphenol A-type epoxy resin in an amount of 10 to 100% by weight, in particular, 50 to 100% by weight.

A preferable monofunctional epoxy resin is a compound having one epoxy group in its molecule, the compound having an alkyl group having a carbon number of 6 to 28. Examples thereof include C6-C28 alkyl glycidyl ether, C6-C28 fatty acid glycidyl ester, C6-C28 alkylphenol glycidyl ether, and the like. A preferred example is C6-C28 alkyl glycidyl ether. These epoxy resins may be used in combination.

In addition, as a component of the resin 50, a curing agent is mixed with the epoxy resin as listed above. The epoxy resin may be of one-pack type in which all components are mixed together or of two-pack type in which an epoxy resin and a curing agent are stored separately and used upon mixing. Accordingly, as the curing agent, a curing agent typically used for a one-pack type epoxy resin or a curing agent typically used for a two-pack type epoxy resin may be used in the invention. Preferred examples of the curing agent include an amine compound, an imidazole compound, a modified amine compound, and a modified imidazole compound.

Examples of the amine compound include: dicyandiamide; aliphatic polyamine, such as diethylenetriamine, triethylenetetramine, and diethylaminopropylamine; aromatic polyamine, such as m-xylene diamine, and diaminodiphenyl methane; alicyclic polyamine, such as isophorone diamine, and methylenedianiline (MDA); polyamide; and the like.

Examples of the imidazole compound include 2-methylimidazole, 2-ethyl-4-methylimidazole, 2-phenylimidazole, and the like.

Examples of the modified amine compound include an epoxy-polyamine adduct prepared by adding an amine compound to the epoxy compound, and the like. Example of the modified imidazole compound include an imidazole adduct prepared by adding an imidazole compound to the epoxy compound, and the like.

Among these curing agents, a latent curing agent used for one-pack type epoxy resin is preferable. In particular, in view of the curing property, a latent curing agent containing modified amine in an amount of 5 to 95% by weight relative to the total weight of the curing agent, and containing dicyandiamide in an amount of 95 to 5% by weight relative to the total weight of the curing agent.

The blending amount of the curing agent is preferably 3 to 60 parts by weight per 100 parts by weight of the epoxy resin, and more preferably 5 to 40 parts by weight per 100 parts by weight of the epoxy resin.

The resin 50 may be further blended, as needed, with other additives, such as a curing accelerator, a defoaming agent, a leveling agent, a dye, and a pigment.

EXAMPLES

Examples and Comparative Examples of the invention are described below.
<Measurement of Thermal Conductivity and Adhesive Strength>

The resin composition containing an electrically insulating filler, the resin composition constituting the sealing body, was prepared by mixing the following components (A) to (D) together with a curing accelerator.

Component (A) (thermosetting resin): epoxy resin, specifically, bisphenol A-type epoxy resin (jER® 828 (trade name) available from Japan Epoxy Resins Co., Ltd.; specific gravity 1.17; 100 parts by weight)

Component (B) (curing agent): dicyandiamide (AJI-CURE® AH-154 (trade name) available from Ajinomoto Fine-Techno Co., Inc.; 8 parts by weight)

Component (C) (insulating filler): alumina fillers different in shape, specifically, at least one of a spherical alumina filler having a diameter of 40 μm and a scale-like alumina filler having a thickness of 5 μm Component (D) (reaction diluent, i.e., crosslink density adjusting agent): alkyl glycidyl ether (YED216M (trade name) available from Japan Epoxy Resins Co., Ltd.; 10 parts by weight)

Curing accelerator: AJICURE® PN-23 (trade name) available from Ajinomoto Fine-Techno Co., Inc.; specific gravity 1.21; 1 part by weight)

Example 1

As Example 1, the sealing body 5 having the same three-layer structure (the thickness of each layer is 1 mm) as shown in FIG. 1 was produced. The content of the spherical filler in the first layer 5A was 60% by weight. In the second layer 5B, only the scale-like filler was mixed, the content of which was 60% by weight. The thermal conductivity of the sealing body 5 thus produced was measured. The thermal conductivity is generally defined as the quantity of heat that flows through a unit area in a unit time with a unit temperature gradient of 1° C. per unit distance. Here, the thermal conductivity was measured by a laser flash method, which is a commonly used method for measurement thereof.

For measuring the adhesive strength of the sealing body 5, a copper sheet and a copper column of 5 mm in diameter and 10 mm in length were prepared. A resin composition containing the spherical filler (the filler content was 60% by weight) was applied in an amount of 1 mg onto one end surface of the copper column and an area of a surface of the copper sheet, the end surface and the area being to be interfaces with the sealing body. The resin compositions thus applied were cured, whereby the first layers 5A in the sealing body 5 was formed. Subsequently, 1 mg of a resin composition containing the scale-like filler (the filler content was 60% by weight) was sandwiched between the two first layers and cured, whereby the second layer 5B that does not include the interfaces with copper was formed. After the sealing body 5 having the same three-layer structure as shown in FIG. 1 was produced in such a manner, the copper sheet was held unmoved, and the copper column bonded to the copper sheet by the sealing body 5 was pulled at a rate of 50 mm/min, during which the stress was measured until the sealing body 5 was separated from the copper sheet or copper column at the interface, or the sealing body 5 was ruptured. The maximum stress in this measurement was referred to as the adhesive strength exerted by the sealing body 5.

The measurement was performed 10 times each for the thermal conductivity and the adhesive strength, and the average thereof was calculated.

Examples 2 to 11

The type and content of the filler to be contained in the first layer 5A and the second layer 5B were varied as shown in Table 1, and the thermal conductivity and the adhesive strength in each example were measured.

Comparative Example 1

A sealing body in which the portions positionally corresponding to the first layer 5A and the second layer 5B in the sealing body 5 were formed of a resin composition containing only the spherical filler 51 in an amount of 50% by weight was produced.

Comparative Example 2

A sealing body in which the portions positionally corresponding to the first layer 5A and the second layer 5B in the sealing body 5 were formed of a resin composition containing only the spherical filler 51 in an amount of 60% by weight was produced.

Comparative Example 3

A sealing body in which the portions positionally corresponding to the first layer 5A and the second layer 5B in the sealing body 5 were formed of a resin composition containing only the spherical filler 51 in an amount of 70% by weight was produced.

Comparative Example 4

A sealing body in which the portions positionally corresponding to the first layer 5A and the second layer 5B in the sealing body 5 were formed of a resin composition containing only the spherical filler 51 in an amount of 80% by weight was produced.

Comparative Example 5

A sealing body in which the portions positionally corresponding to the first layer 5A and the second layer 5B in the sealing body 5 were formed of a resin composition containing only the spherical filler 51 in an amount of 90% by weight was produced.

Comparative Example 6

A sealing body in which the portion positionally corresponding to the first layer 5A in the sealing body 5 was formed of a resin composition containing only the spherical filler 51 in an amount of 50% by weight, and the portion positionally corresponding to the second layer 5B in the sealing body 5 was formed of a resin composition containing only the spherical filler 51 in an amount of 90% by weight was produced.

Comparative Example 7

A sealing body in which the portion positionally corresponding to the first layer 5A in the sealing body 5 was formed of a resin composition containing only the spherical filler 51 in an amount of 70% by weight, and the portion positionally corresponding to the second layer 5B in the sealing body 5 was formed of a resin composition containing 70% by weight of the spherical filler 51 and 5% by weight of the scale-like filler 52 was produced.

Comparative Example 8

A sealing body in which the portion positionally corresponding to the first layer 5A in the sealing body 5 was formed of a resin composition containing only the spherical filler 51 in an amount of 70% by weight, and the portion positionally corresponding to the second layer 5B in the sealing body 5 was formed of a resin composition containing 80% by weight of the spherical filler 51 and 5% by weight of the scale-like filler 52 was produced.

Comparative Example 9

A sealing body in which the portion positionally corresponding to the first layer 5A in the sealing body 5 was formed of a resin composition containing only the spherical filler 51 in an amount of 80% by weight, and the portion positionally corresponding to the second layer 5B in the sealing body 5 was formed of a resin composition containing 80% by weight of the spherical filler 51 and 5% by weight of the scale-like filler 52 was produced.

In the above Examples 2 to 11 and Comparative Examples 1 to 9, the heat conductivity and adhesive strength of the sealing body were measured in the same manner as in Example 1. The measurement results are shown in Table 1.

According to the result, it was judged whether the sealing bodies of Examples 1 to 11 and Comparative Examples 1 to 9 were applicable or not as a sealing body for a mounting structure. The judgment results are also shown in Table 1. The letters "A", "B", and "X" in the column "Judgment" in Table 1 indicate "particularly excellent as a sealing body", "applicable practically", and "not applicable practically", respectively. As for the judgment criteria, a sealing body having an adhesive strength of 58.8 N (6 kgf) or more and a thermal conductivity of 1 W/m·K or more was judged as applicable practically ("B").

as 29.4 N (3 kgf). As such, Comparative Example 5 failed to meet the condition of the adhesive strength required for the sealing body.

In Comparative Example 6, in which the filler content of the portion positionally corresponding to the first layer 5A was below 60% by weight. Because of this, despite the high content of the filler (the spherical filler 51) in the portion positionally corresponding to the second layer 5B of as high as 90% by weight, the thermal conductivity did not exceed 1 W/m·K or more. As such, Comparative Example 6 failed to meet the condition of the thermal conductivity required for the sealing body.

In Comparative Examples 7 to 9, the filler contents in both of the portions positionally corresponding to the first layer 5A and second layer 5B were more than 60% by weight and 85% by weight or less. Because of this, an adhesive strength of 58.8 N (6 kgf) or more was achieved. However, since the content of the scale-like filler in the portion positionally corresponding to the second layer 5B was below 10% by weight,

TABLE 1

| | Filler Content (% by weight) | | | Thermal | Adhesive | |
|---|---|---|---|---|---|---|
| | First layer | Second layer | | | | |
| | Spherical filler | Spherical filler | Scale-like filler | conductivity (W/m · K) | strength (N) | Judgment |
| Ex. 1 | 60 | | 60 | 1 | 73.5 | B |
| Ex. 2 | 60 | | 80 | 1.3 | 73.5 | B |
| Ex. 3 | 60 | | 90 | 1.8 | 73.5 | A |
| Ex. 4 | 70 | | 70 | 1.5 | 68.6 | B |
| Ex. 5 | 70 | | 80 | 1.8 | 68.6 | B |
| Ex. 6 | 70 | | 60 | 1.9 | 68.6 | A |
| Ex. 7 | 80 | | 80 | 1.9 | 58.8 | A |
| Ex. 8 | 80 | | 90 | 2 | 58.8 | A |
| Ex. 9 | 70 | 70 | 10 | 1 | 68.6 | B |
| Ex. 10 | 70 | 80 | 10 | 1.2 | 68.6 | B |
| Ex. 11 | 80 | 80 | 10 | 1.4 | 58.8 | B |
| Com. Ex. 1 | 50 | 50 | | 0.5 | 75.5 | X |
| Com. Ex. 2 | 60 | 60 | | 0.6 | 73.5 | X |
| Com. Ex. 3 | 70 | 70 | | 0.8 | 68.6 | X |
| Com. Ex. 4 | 80 | 80 | | 0.9 | 58.8 | X |
| Com. Ex. 5 | 90 | 90 | | 1.3 | 29.4 | X |
| Com. Ex. 6 | 50 | 90 | | 0.8 | 75.5 | X |
| Com. Ex. 7 | 70 | 70 | 5 | 0.8 | 68.6 | X |
| Com. Ex. 8 | 70 | 80 | 5 | 0.9 | 68.6 | X |
| Com. Ex. 9 | 80 | 80 | 5 | 0.9 | 58.8 | X |

As is evident from measurement results in Table 1, in the sealing bodies in which the scale-like filler was added in the second layer 5B in an amount of 10% by weight or more to allow the second layer 5B to have a higher thermal conductivity than the first layer 5A, the thermal conductivity of the resin layer as a whole was 1 W/m·K or more, while the adhesive strength was being maintained at 58.8 N (6 kgf) or more.

In contrast, in each of Comparative Examples 1 to 4, in which the portion positionally corresponding to the second layer 5B contained only the spherical filler 51, the thermal conductivity was less than 1 W/m·K, although the adhesive strength was 58.8 N (6 kgf) or more. In short, Comparative Examples 1 to 4 failed to meet the condition of the thermal conductivity required for the sealing body.

In Comparative Example 5, in which both of the portions positionally corresponding to the first layer 5A and second layer 5B contained as much as 90% by weight of the spherical filler 51, the thermal conductivity was as good as 1 W/m·K or more. However, the adhesive strength was reduced to as low Comparative Examples 7 to 9 failed to meet the condition of the thermal conductivity required for the sealing body.

Based on the foregoing results, it is understood that in order to achieve the required condition of the thermal conductivity, the content of the scale-like filler 52 in the second layer 5B must be 10% by weight or more, and the filler content in the first layer 5A must be 60% by weight or more.

<Temperature Cycle Test>

The sealing body 5 of each example (see FIG. 1), which exhibited excellent heat dissipation performance in the above measurement, was subjected to a temperature cycle test to check if it can maintain a high adhesive strength while being used on a semiconductor device or electronic component.

A CSP (Chip Scale Package) in which the chip size was 13 mm×13 mm, the electrode size (diameter) was 0.5 mm, the electrode pitch was 0.8 mm, and the carrier substrate (the interposer board) was made of ceramics was mounted on a 1.6-mm-thick glass epoxy board with a circuit printed thereon with a solder paste (M705-221BM5-K (trade name) available from Senju Metal Industry Co., Ltd.).

Thereafter, each of the sealing bodies having the same configurations as those of Examples 1 to 11 and Comparative Examples 1 to 9 as described above was formed between the semiconductor chip 1 and the circuit board 2, whereby ten mounting bodies were produced for each example. In curing the resin composition, the heating temperature was set at 150° C. and the heating time was set at 30 minutes.

Each mounting structure thus produced was subjected to a temperature cycle test. Specifically, the mounting structure was allowed to stand at −40° C. for 30 minutes and to stand at 85° C. for 30 minutes, which was defined as one cycle. After having undergone a predetermined number of cycles, the mounting structure was subjected to a continuity test for checking the electric connection between the CSP and the circuit board. The results are shown in Table 2. In Table 2, "OK" in the column "Temperature cycle test" indicates that there was electric continuity in all of the mounting structures after 1000 cycles or more (acceptable); and "NG" in the column "Temperature cycle test" indicates that some of the mounting structures were electrically discontinued because of a broken wire and the like before reaching 1000 cycles (not acceptable).

TABLE 2

| | Filler Content (% by weight) | | | |
| | First layer | Second layer | | |
| | Spherical filler | Spherical filler | Scale-like filler | Temperature cycle test |
|---|---|---|---|---|
| Ex. 1 | 60 | | 60 | OK |
| Ex. 2 | 60 | | 80 | OK |
| Ex. 3 | 60 | | 90 | OK |
| Ex. 4 | 70 | | 70 | OK |
| Ex. 5 | 70 | | 80 | OK |
| Ex. 6 | 70 | | 60 | OK |
| Ex. 7 | 80 | | 80 | OK |
| Ex. 8 | 80 | | 90 | OK |
| Ex. 9 | 70 | 70 | 10 | OK |
| Ex. 10 | 70 | 80 | 10 | OK |
| Ex. 11 | 80 | 80 | 10 | OK |
| Com. Ex. 1 | 50 | 50 | | OK |
| Com. Ex. 2 | 60 | 60 | | OK |
| Com. Ex. 3 | 70 | 70 | | OK |
| Com. Ex. 4 | 80 | 80 | | OK |
| Com. Ex. 5 | 90 | 90 | | NG |
| Com. Ex. 6 | 50 | 90 | | OK |
| Com. Ex. 7 | 70 | 70 | 5 | OK |
| Com. Ex. 8 | 70 | 80 | 5 | OK |
| Com. Ex. 9 | 80 | 80 | 5 | OK |

As is evident from Table 2, in Examples 1 to 11, even after 1000 cycles or more, there were no mounting structures in which the CSP and the circuit board were electrically discontinued. In Comparative Examples 1 to 9, the mounting structures except for that of Comparative Example 5 were acceptable. The reason for this is considered as follows. In the mounting structure of Comparative Example 5, the filler contents in both of the portions positionally corresponding to the first layer 5A and the second layer 5B were 90% by weight, and thus, in particular, the adhesion between the portion positionally corresponding to the first layer 5A, and the semiconductor chip 1 and the circuit board 2 was small, resulting in a reduction in the adhesive strength due to the sealing body. This caused separation at the interface with the semiconductor chip or the circuit board during the temperature cycle test.

In the above-described examples, with respect to the sealing body having the same three-layer structure as that in Embodiment 1 (see FIG. 1), the measurements for checking thermal conductivity and adhesive strength were performed, and the temperature cycle test was conducted. It should be noted that, with respect to the sealing bodies of Embodiments 2 and 3 (see FIGS. 3 and 4), the same measurements and test were performed, and the results were the same as those in the above Examples.

It should be further noted that, while an alumina filler was mixed in the sealing body in the above-described examples, mixing other fillers, such as silica, boron nitride, magnesia, aluminum nitride, and silicon nitride fillers, gave the same results.

It should be furthermore noted that when the sealing body was configured to be a structure composed of more than three layers wherein the insulating resin layer had a thermal conductivity gradient increasing from the region that included an interface with the semiconductor device or electronic component or with the circuit board toward the region that did not include the interface, the same results were obtained. In addition, when the sealing body was provided with a thermal conductivity gradient not by forming the sealing body in a layered structure but by varying the filler content therein, the same results were obtained.

The mounting structure according to the resent invention is widely applicable for mounting various electronic components on circuit boards.

Although the invention has been described in terms of the presently preferred embodiments, it is to be understood that such disclosure is not to be interpreted as limiting. Various alterations and modifications will no doubt become apparent to those skilled in the art to which the invention pertains, after having read the above disclosure. Accordingly, it is intended that the appended claims be interpreted as covering all alterations and modifications as fall within the true spirit and scope of the invention.

The invention claimed is:

1. A mounting structure comprising:
   an electronic component having a plurality of terminals;
   a circuit board having a plurality of electrodes arranged so as to face the terminals;
   a bonding portion where the terminals and the electrodes corresponding to the terminals are bonded to each other; and
   a sealing portion sealing the bonding portion by filling a gap between the electronic component and the circuit board, the sealing portion containing a resin; and
   a reinforcing portion having a higher adhesive strength than the sealing portion and disposed around a circumference of the sealing portion, wherein:
   the sealing portion includes first regions closer to respective interfaces with the circuit board and the electronic component and a second region away from the interfaces, and
   the first regions have a higher adhesion than the second region and the second region has a higher thermal conductivity than the first regions.

2. The mounting structure in accordance with claim 1, wherein the first regions are first layers in contact with the circuit board and the electronic component, respectively, and the second region is a second layer in contact with none of the circuit board and the electronic component, and the first layers and the second layer are laminated to each other.

3. The mounting structure in accordance with claim 2, wherein the first layers include a spherical filler and a thermosetting resin.

4. The mounting structure in accordance with claim 2, wherein the second layer includes a scale-like filler and a thermosetting resin.

5. The mounting structure in accordance with claim 3, wherein the first layers contain the spherical filler in an amount of 60 to 80% by weight.

6. The mounting structure in accordance with claim 4, wherein the second layer contains the scale-like filler in an amount of 10 to 90% by weight.

7. An electronic apparatus comprising a mounting structure and a housing accommodating the mounting structure, the mounting structure comprising:
an electronic component having a plurality of terminals;
a circuit board having a plurality of electrodes arranged so as to face the plurality of terminals;
a bonding portion where the terminals and the electrodes corresponding to the plurality of terminals are bonded to each other;
a sealing portion sealing the bonding portion by filling a gap between the electronic component and the circuit board, the sealing portion containing a resin; and
a top side portion disposed on a surface of the electronic component opposite to the surface facing the circuit board, wherein:
the sealing portion comprises two or more layers including a first layer and a second layer, the first layer has a higher adhesion than the second layer, the second layer has a higher thermal conductivity than the first layer, the first layer is disposed near interfaces with at least one of the circuit board and the electronic component, and the second layer is disposed away from the interface,
the top side portion comprises two or more layers including a top-side first layer and a top-side second layer, the top-side first layer has a higher adhesion than the top-side second layer, the top-side second layer has a higher thermal conductivity than the top-side first layer, the top-side first layer is disposed closer to the surface of the electronic component, the second top-side layer is disposed away from the surface of the electronic component, and the first and second top-side layers are laminated,
the housing comprises a heat dissipation sheet or a highly thermally conductive adhesive, and
the mounting structure is connected to the housing so that the top-side second layer is in contact with the heat dissipation sheet or the highly thermally conductive adhesive interposed therebetween.

8. The mounting structure in accordance with claim 2, further comprising:
a cover portion formed so as to close the electronic component, the sealing portion and the reinforcing portion in cooperation with the circuit board, wherein
the cover portion includes a top-side first layer and a top-side second layer, the top-side first layer has a higher adhesion than the top-side second layer, the top-side second layer has a higher thermal conductivity than the top-side first layer, and the first and second top-side layers are laminated.

9. The mounting structure in accordance with claim 1, wherein the sealing portion is configured such that, in at least part thereof, one or more first layers and one or more second layers are laminated to each other such that the adhesion is reduced stepwise from the region near the interface with at least one of the circuit board and the electronic component toward the region away from the interface, and the thermal conductivity is increased stepwise from the region near the interface toward the region away from the interface.

10. The mounting structure in accordance with claim 1, wherein the sealing portion is formed such that, in at least part thereof, the adhesion is reduced gradually from the region near the interface with at least one of the circuit board and the electronic component toward the region away from the interface, and the thermal conductivity is increased gradually from the region near the interface toward the region away from the interface.

11. An electronic apparatus having a housing and incorporating the mounting structure of claim 1, wherein the circuit board in the mounting structure is brought into contact with the housing with a heat dissipation sheet or a highly thermally conductive adhesive interposed therebetween.

12. An electronic apparatus having a housing and incorporating the mounting structure of claim 8, wherein the top-side second layer in the mounting structure is brought into contact with the housing with a heat dissipation sheet or a highly thermally conductive adhesive interposed therebetween.

13. The mounting structure in accordance with claim 2, wherein the first layers include first fillers and the second layer includes second fillers of which shape is different from that of the first fillers.

* * * * *